US006652906B1

United States Patent
Pinarbasi

(10) Patent No.: US 6,652,906 B1
(45) Date of Patent: Nov. 25, 2003

(54) FABRICATION OF A MAGNETORESISTANCE SENSOR STRUCTURE HAVING A SPACER LAYER PRODUCED BY MULTIPLE DEPOSITION AND OXIDATION STEPS

(75) Inventor: Mustafa Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/300,218

(22) Filed: Nov. 19, 2002

(51) Int. Cl.[7] ................................................. B05D 5/12
(52) U.S. Cl. ...................... 427/130; 427/131; 427/132; 427/294; 427/404; 427/419.2; 428/693; 428/702; 428/900
(58) Field of Search ................... 427/130, 131, 427/132, 294, 404, 419.2; 428/900, 693, 702

(56) References Cited

U.S. PATENT DOCUMENTS

| 5,315,282 A | 5/1994 | Shinjo et al. |
|---|---|---|
| 5,871,622 A | 2/1999 | Pinarbasi |
| 5,903,708 A | 5/1999 | Kano et al. |
| 5,948,553 A | 9/1999 | Kamijo |

Primary Examiner—Bernard Pianalto
(74) Attorney, Agent, or Firm—William D. Gill; Ron Feece

(57) ABSTRACT

A magnetoresistance sensor structure is fabricated by providing a substrate structure, depositing a magnetic pinning structure on the substrate structure, and depositing an oxidized copper spacer layer overlying the magnetic pinning structure. The deposition of the oxidized copper spacer layer includes depositing a first copper sublayer, oxidizing the first copper sublayer, depositing a second copper sublayer, and oxidizing the second copper sublayer. More deposition and oxidation steps may be used as necessary. A sensing structure is deposited overlying the oxidized copper spacer layer.

17 Claims, 5 Drawing Sheets

FABRICATION OF A MAGNETORESISTANCE SENSOR STRUCTURE HAVING A SPACER LAYER PRODUCED BY MULTIPLE DEPOSITION AND OXIDATION STEPS

This invention relates to the fabrication of a magnetoresistance sensor structure and, more particularly, to one in which the spacer layer is deposited and oxidized in multiple steps for improved magnetic performance.

BACKGROUND OF THE INVENTION

A magnetoresistance (MR) sensor is used in a read/write head to read magnetic fields on a recording medium of a magnetic storage device. An example is the read/write head of a computer hard disk or a magnetic recording tape. The read/write head is positioned closely adjacent to the recording medium, separated from the recording medium by an air bearing which allows the read/write head to fly over the surface of the hard disk. A data bit is written onto an area of the recording medium using the writing portion of the read/write head by locally changing its magnetic state. That magnetic state is later sensed by the MR sensor to read the data bit.

One of the important types of MR sensors is the giant magnetoresistance (GMR) sensor. The general technical basis, construction, and operation of the GMR sensor are described, for example, in U.S. Pat. No. 5,436,778, whose disclosure is incorporated by reference.

The structure of the GMR sensor includes two thin-film stacks separated by an intermediate nonmagnetic film, typically a copper film, serving as a spacer layer. The lower thin-film includes a magnetic pinning structure, and the upper thin-film stack includes a sensing (free) layer that responds to an external magnetic field. A magnetic biasing structure is present, preferably in the form of a contiguous junction positioned laterally adjacent to the two thin-film stacks and the spacer layer.

The available MR sensors are fully operable and are widely used in magnetic read/write heads. However, there is an ongoing desire and a need to improve their reading performance. The present invention fulfills this need, and further provides related advantages.

SUMMARY OF THE INVENTION

The present invention provides a method of fabricating a magnetoresistance sensor structure in which the electrical resistance performance of the spacer layer is improved. Consequently, the performance of the magnetoresistance sensor structure is also improved. The present approach may be practiced using the same fabrication apparatus as in conventional processing, and with only a change to the procedures.

In accordance with the invention, a method for fabricating a magnetoresistance sensor structure comprises the steps of providing a substrate structure (such as an aluminum oxide substrate with a seed structure on it), depositing a magnetic pinning structure on the substrate structure, and depositing an oxidized metallic spacer layer overlying the magnetic pinning structure. The oxidized metallic spacer layer is deposited by the steps of depositing a first metallic sublayer, oxidizing the first metallic sublayer, depositing a second metallic sublayer, and oxidizing the second metallic sublayer. Additional sublayers may be deposited and oxidized as well, in this same alternating deposition/oxidation manner. A sensing structure is deposited overlying the oxidized metallic spacer layer.

The oxidized metallic spacer layer is preferably an oxidized copper spacer layer, and the sublayers are oxidized copper sublayers. A total thickness of the oxidized metallic spacer layer is preferably from about 15 Angstroms to about 25 Angstroms. It is also preferred that each of the metallic sublayer/oxidized metallic sublayer pairs be of about the same thickness.

The deposition of the metallic spacer layer is preferably accomplished by depositing the first metallic sublayer in a vacuum having a first-deposition oxygen partial pressure, oxidizing the first metallic sublayer in a vacuum having a first-oxidation oxygen partial pressure greater than the first-deposition oxygen partial pressure, depositing the second metallic sublayer in a vacuum having a second-deposition oxygen partial pressure, and oxidizing the second metallic sublayer in a vacuum having a second-oxidation oxygen partial pressure greater than the second-deposition oxygen partial pressure. That is, there is usually a small oxygen partial pressure in the vacuum chamber when the metallic sublayers are deposited, and the oxygen partial pressure is increased for the oxidation steps. The oxidation oxygen partial pressure during the oxidation steps is typically of from about $1\times10^{-6}$ to about $1\times10^{-4}$ Torr, most preferably about $2\times10^{-5}$ Torr. The oxygen partial pressure is then reduced for subsequent sublayer deposition steps, if any.

After the sensing structure is deposited, a cap layer is deposited overlying the sensing structure. A magnetic biasing structure is also deposited, preferably in the form of a contiguous junction that laterally abuts the previously deposited magnetic pinning structure and metallic spacer layer on each side. Alternatively, an in-stack magnetic biasing structure may be used. The present approach thus may be used to fabricate a giant magnetoresistance (GMR) sensor.

The present approach deposits the oxidized copper (or other metal) spacer layer in two or more steps, each of which includes depositing the copper sublayer and then oxidizing that sublayer and any sublayer already deposited. Two steps with two sublayers has provided an improvement in the performance of the spacer layer, and more deposition/oxidation steps may be used if desired. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
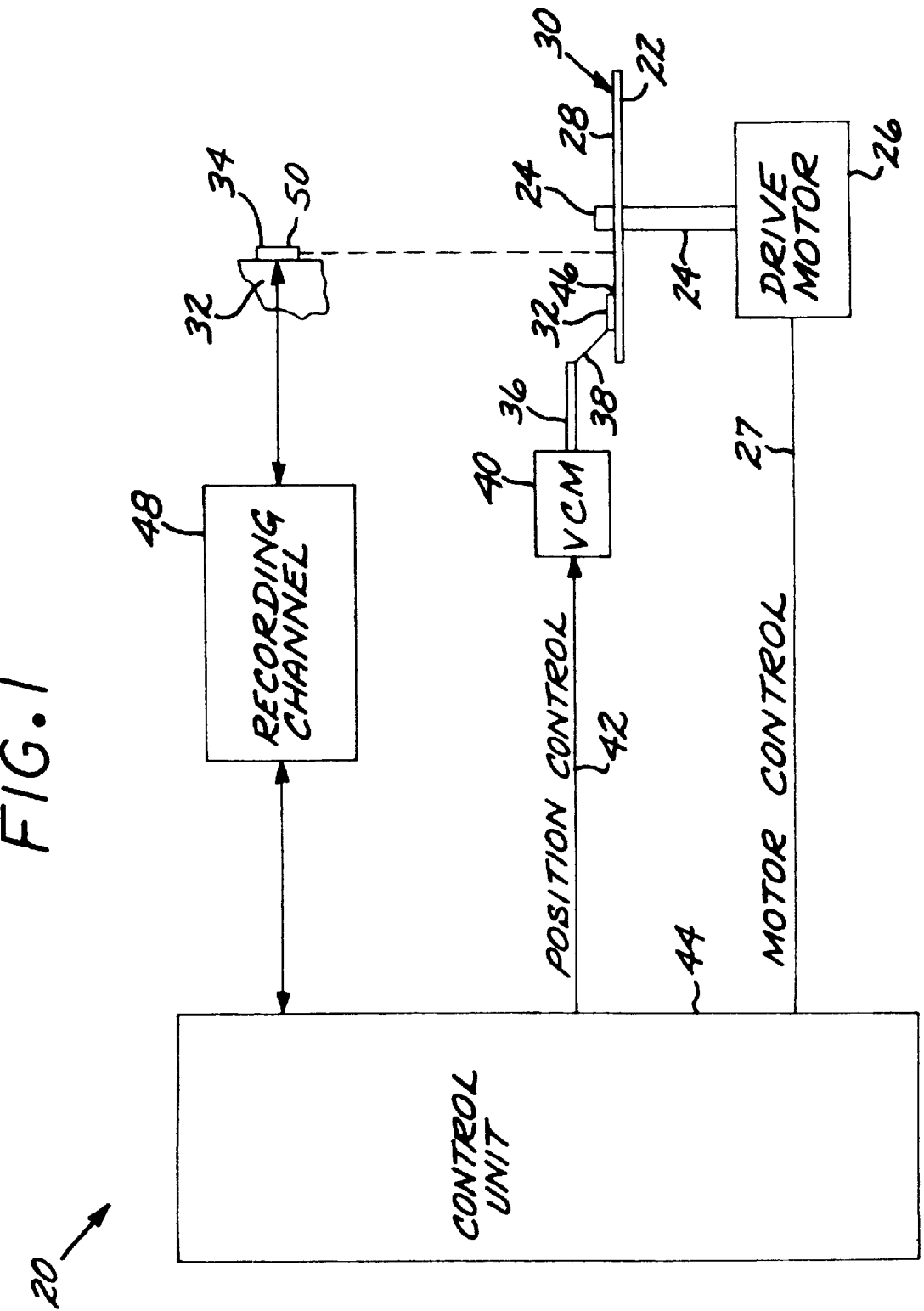
FIG. 1 is a schematic diagram of a magnetic disk data storage system.

FIG. 1 schematically depicts a data storage system, here depicted as a magnetic disk drive system 20, with which the present approach may be used. The magnetic disk drive system 20 includes a rotatable magnetic storage disk 22 that is supported on a spindle 24 and rotated by a disk drive motor 26 under motor control 27 of a control unit 44. A magnetic storage medium 28 is deposited on a surface 30 of the magnetic storage disk 22.

A slider 32 is positioned in facing relation to the magnetic storage disk 22. The slider 32 supports at least one read/write head 34 in facing relation to the magnetic storage medium 28 of the magnetic storage disk 22. The slider 32 is mounted to an actuator arm 36 by a suspension 38. The actuator arm 36 and the slider 32 move radially inwardly and outwardly so that the combined inward/outward motion of the slider 32 and the rotation of the magnetic storage disk 22 allows the read/write head 34 to be placed into facing relation to the entire area of the magnetic storage medium 28. The actuator arm 36 is driven by an actuator 40 (depicted as a voice coil motor or VCM) under the radial position control 42 of the control unit 44.

The suspension 38 generates a slight spring force which biases the slider 32 toward the surface 30 of the magnetic storage disk 22. During sensor operation the magnetic storage disk 22 turns, and an air bearing is created between the downwardly facing surface of the slider 32, termed the air bearing surface 46 or ABS, and the upwardly facing surface 30 of the magnetic storage disk 22. (Only the downwardly oriented slider 32 is illustrated, but there may also or instead be an upwardly oriented slider facing the bottom side of the magnetic storage disk.) The air bearing counterbalances the slight spring force of the suspension 38 and supports the slider 32 a small distance above the surface 30 so that the read/write head "flies" over the surface 30 as the magnetic storage disk 22 rotates.

The read/write head 34 writes data onto the magnetic storage medium 28 by altering magnetic states in the magnetic storage medium, and also reads data from the magnetic storage medium 28 by sensing the magnetic states in the magnetic storage medium 28. The writing and reading commands, as well as the data to be written or read, are transmitted between the control unit 44 and the read/write head 34 over a recording channel 48. The present approach is concerned with a magnetoresistance (MR) sensor structure 50, preferably a giant magnetoresistance (GMR) structure that is part of the read/write head 34. GMR sensor structures 50 are known in the art except for the modifications discussed herein, see for example the discussion in U.S. Pat. No. 5,436,778.

The preceding discussion is a simplified description of the data storage system in the form of the magnetic disk drive system 20, to set the environment in which the present invention is used. The present invention is also applicable to other types of magnetic data storage systems such as tape drives and their read/write heads.

Figure 2:
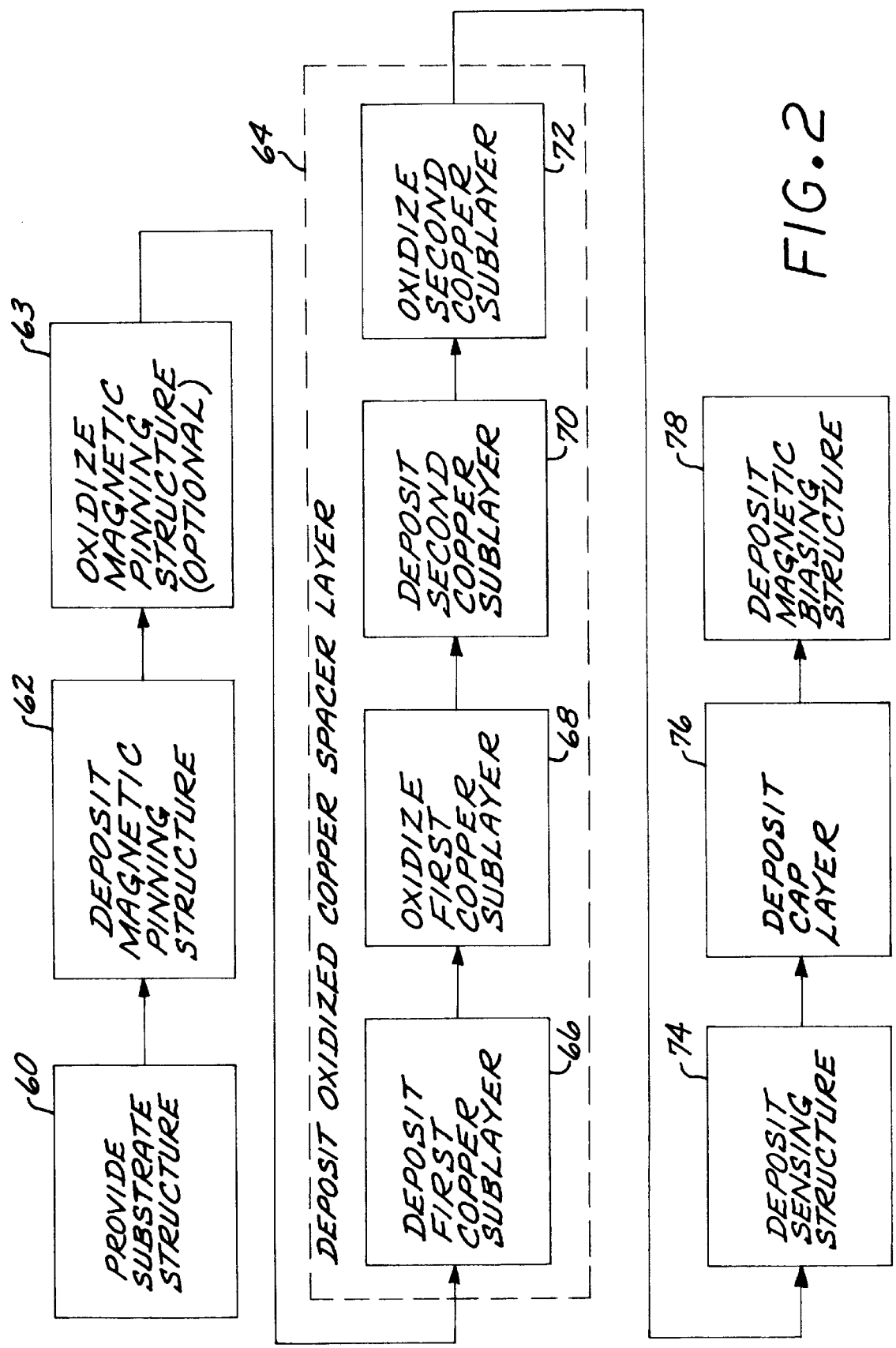
FIG. 2 is a block diagram of a method for fabricating a magnetoresistance sensor structure.
Figure 3:
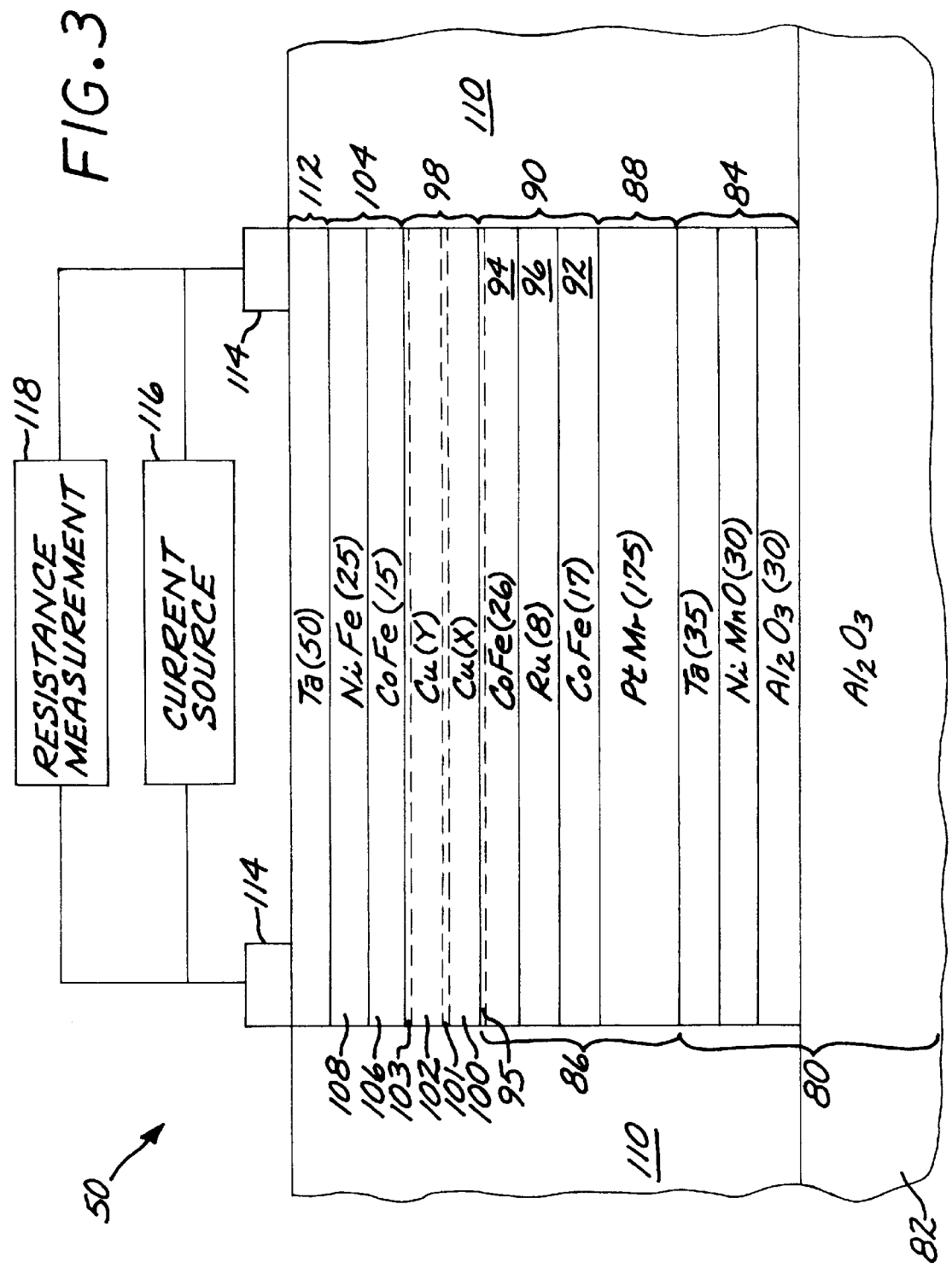
FIG. 3 is a schematic sectional view of a magnetoresistance sensor structure.
Figure 4:
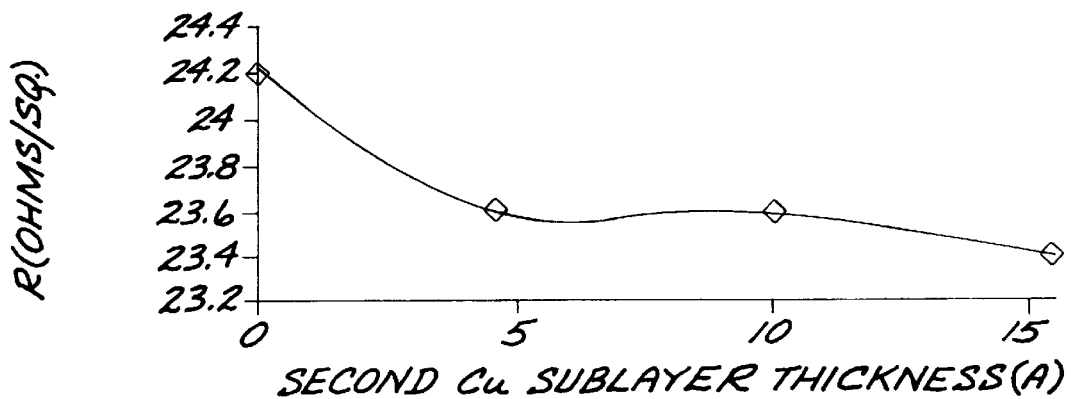
FIG. 4 is a graph of R in ohms per square as a function of the second copper sublayer thickness in Angstroms.

FIG. 2 shows in block diagram form a method for fabricating the GMR sensor structure 50. FIG. 3, which is not drawn to scale, schematically depicts a preferred form of the GMR sensor structure 50. A substrate structure 80 is provided, numeral 60. The substrate structure 80 includes a substrate 82 with a multilayer seed layer structure 84 that is deposited on the substrate 82 during the processing. In FIG. 3, preferred materials of construction of each of the layers are indicated. Following a standard convention, the preferred thickness in Angstroms of each layer is indicated in parentheses after the material of construction.

A magnetic pinning structure 86 is deposited on the substrate structure 80, numeral 62. In the illustrated embodiment, the magnetic pinning structure 86 includes a transverse pinning layer 88 and a transverse pinned layer structure 90. The transverse pinned layer structure 90 overlies and contacts the transverse pinning layer 88, which in turn overlies and contacts the substrate structure 80. The transverse pinned layer structure 90 is formed of two ferromagnetic films 92 and 94, separated by an intermediate layer 96. The two ferromagnetic films 92 and 94 are strongly antiparallel coupled across the intermediate layer 96. The transverse pinned layer structure 90 is antiparallel coupled to the transverse pinning layer 88.

Optionally, the uppermost layer, here the upper ferromagnetic film 94 of the magnetic pinning structure 86, may be oxidized, numeral 63, to form an upper-ferromagnetic-film oxidized region 95.

An oxidized copper spacer layer 98 is deposited, numeral 64, overlying the magnetic pinning structure 86 by a series of steps. The deposition 64 is accomplished by first depositing, numeral 66, a first copper sublayer 100 and first oxidizing, numeral 68, the first copper sublayer 100 to produce an oxidized-copper first-sublayer region 101. After steps 66 and 68 have been performed, a second copper sublayer 102 is second deposited, numeral 70, and second oxidized, numeral 72, the second copper sublayer 102 to produce an oxidized-copper second-sublayer region 103. Additional copper sublayers may be deposited and oxidized as needed.

The deposition steps 66 and 70 (and the deposition of the upper ferromagnetic film 94) are preferably performed in a vacuum deposition apparatus by a deposition technique such as ion beam sputtering or plasma sputtering. The atmosphere in the vacuum deposition apparatus typically includes a small partial pressure of oxygen. The oxidation steps 68 and 72 (and 63, where used) are preferably accomplished by leaving the structure being fabricated in the vacuum deposition apparatus at a temperature near to room temperature, and typically no more than 20° C. above room temperature, and increasing the oxygen partial pressure to about $2 \times 10^{-5}$ Torr for about 30 seconds. The copper is oxidized to a nonstoichiometric $CuO_x$ form in the case of the sublayer regions 101 and 103, and to a nonstoichiometric $CoFeO_y$ form in the case of the region 95.

The oxidized copper spacer layer 98 preferably has a total thickness of from about 15 Angstroms to about 25 Angstroms, more preferably from about 18 to about 22 Angstroms, and most preferably about 20 Angstroms. If the thickness of the oxidized copper spacer layer 98 is not within this range, the performance of the MR sensor structure 50 is compromised. The total thickness of the oxidized copper spacer layer 98 within this range is apportioned between the two oxidized copper sublayers 100 and 102, and their respective oxidized copper sublayer regions 101 and 103, in the illustration. If there are more than two oxidized copper sublayers, the total thickness within the range discussed above is apportioned between all of the oxidized copper sublayers that are present. That is, the total thickness of the oxidized copper spacer layer 98 remains within the range discussed above, and the thicknesses of all of the sublayers and their respective oxidized regions add to this total thickness of the oxidized copper spacer layer 98.

In studies conducted by the inventor and discussed subsequently, the total thickness of the oxidized copper spacer layer 98 was about 20 Angstroms, and the relative thickness of the sublayers 100 and 102 was a variable that was studied. It was generally determined that having the first copper sublayer 100 and the second copper sublayer 102 to be about the same thickness yielded the best properties in the oxidized copper spacer layer 98 and thence in the MR sensor 50. The exact properties of the MR sensor 50 may be optimized as a function of the relative thicknesses, however. It is believed that the improved properties resulting from the present multiple deposition-and-oxidation approach are due, in part, to the better, smoother surface at the upper surface of the oxidized copper spacer layer 98.

A sensing structure 104 (also termed the "free layer") is deposited, numeral 74, overlying the oxidized copper spacer layer 98. The sensing structure 104 comprises one or more ferromagnetic films. In the illustrated embodiment, the sensing structure 104 has a lower sensing layer 106 overlying and contacting the oxidized copper spacer layer 98, and an upper sensing layer 108 overlying and contacting the lower sensing layer 106.

A cap layer 112 is deposited, numeral 76. In the illustrated case where a magnetic biasing structure 110 is at the sides of the layered stack, the cap 112 is deposited overlying and contacting the sensing structure 104. In the alternative in-stack embodiment of the magnetic biasing structure, the cap layer 112 is deposited overlying and contacting the magnetic biasing structure.

The magnetic biasing structure 110 is deposited, numeral 78. The magnetic biasing structure 110 is illustrated in an embodiment, termed a contiguous junction, wherein it is abutted to the sides of the layered stack whose deposition has been described. In an in-stack embodiment, the magnetic biasing structure 110 may be deposited overlying and contacting the sensing structure 104. Thus, the order of the steps 76 and 78 may be reversed as appropriate.

In steps following the fabrication of the MR sensor 50, electrodes 114 may be deposited onto the cap layer 112. The MR sensor structure 50 is connected externally to a current source 116 and to a resistance measurement device 118.

The structure of the MR sensor may be of this or other types, as long as the oxidized copper spacer layer 98 is prepared by the multi-step approach discussed above. Many other configurations are possible, and any operable materials of construction may be used. Studies performed by the inventor employed the structure of FIG. 3 with the materials indicated and the thickness of each layer in Angstroms indicated in parentheses after the material. The substrate 82 is aluminum oxide of any operable thickness. The seed layer structure 84 is a three-layer structure of 30 Angstroms of aluminum oxide deposited upon the substrate 82, 30 Angstroms of NiMnO deposited on the aluminum oxide layer, and 35 Angstroms of tantalum deposited on the NiMnO layer. The transverse pinning layer 88 is 175 Angstroms of PtMn. The transverse pinned layer structure 90 includes the lower ferromagnetic film 92 of 17 Angstroms of CoFe, the intermediate layer 96 of 8 Angstroms of ruthenium, and the upper ferromagnetic film 94 of 26 Angstroms of CoFe. The oxidized copper spacer layer 98 is 20 Angstroms thick, apportioned between the two oxidized copper sublayers 100 and 102 (indicated as having variable thicknesses of x and y, respectively) as will be discussed subsequently. The sensing structure 104 includes the lower sensing layer 106 of 15 Angstroms of CoFe, and the upper sensing layer 108 of 25 Angstroms of NiFe. The cap layer 112 is 50 Angstroms of tantalum. The contiguous junction magnetic biasing structure 110 is Co—Pt—Cr.

Figure 5:
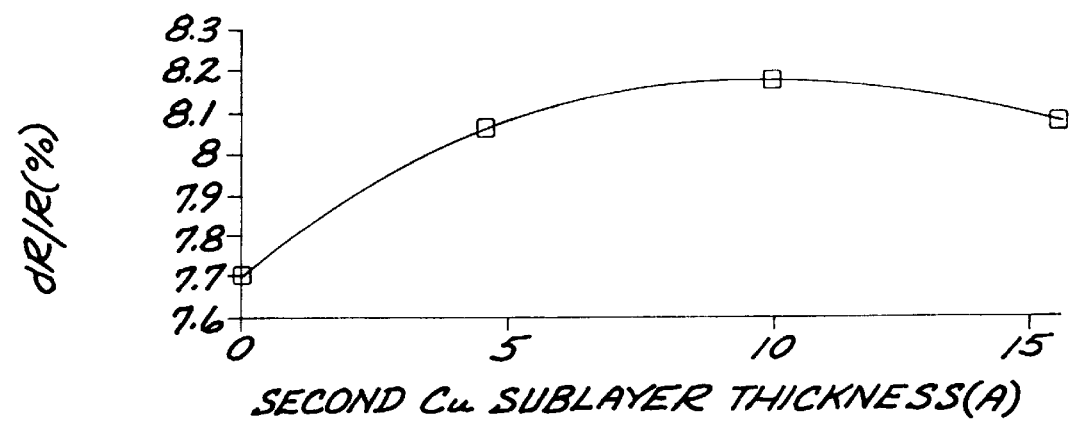
FIG. 5 is a graph of dR/R in percent as a function of the second copper sublayer thickness in Angstroms.
Figure 6:
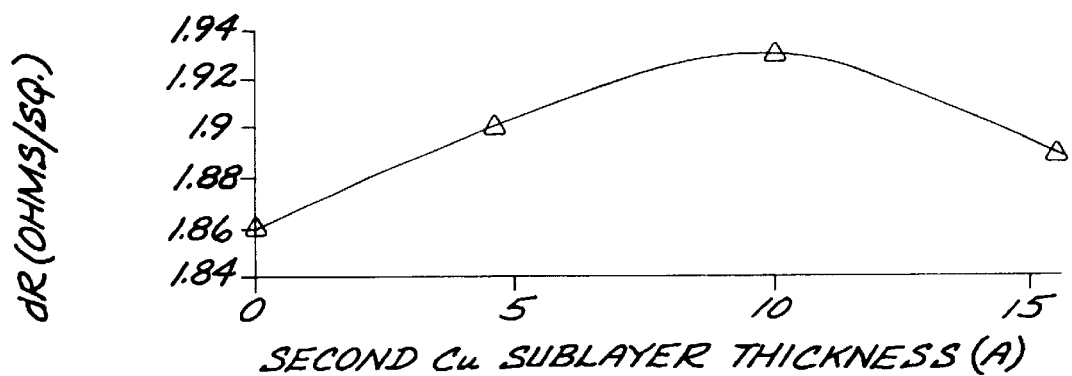
FIG. 6 is a graph of dR in ohms per square as a function of the second copper sublayer thickness in Angstroms.
Figure 7:
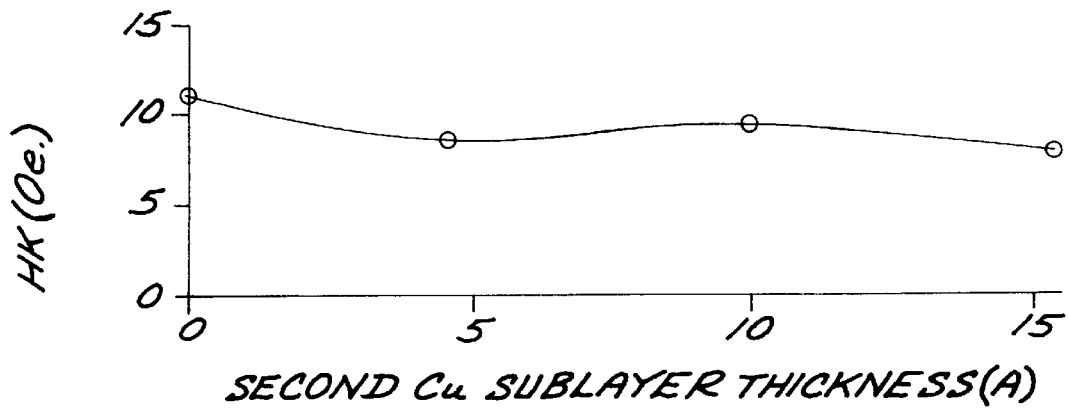
FIG. 7 is a graph of Hk in Oersteds as a function of the second copper sublayer thickness in Angstroms.
Figure 8:
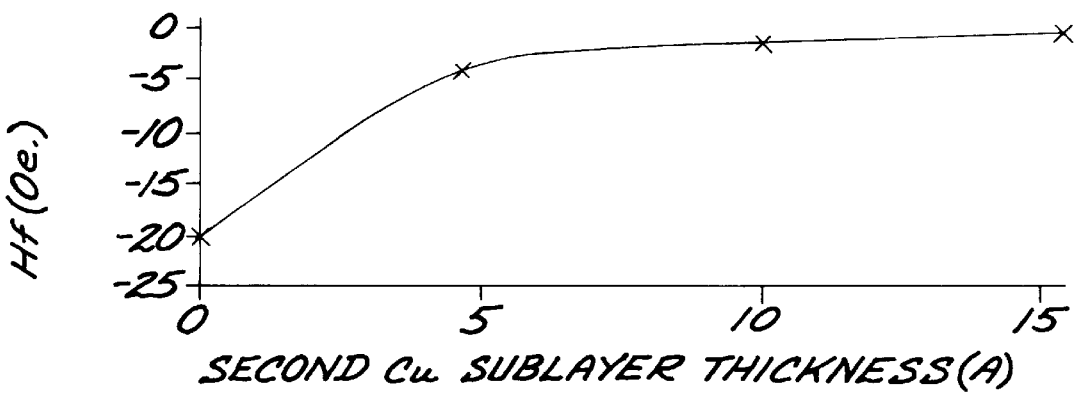
FIG. 8 is a graph of Hf in Oersteds as a function of the second copper sublayer thickness in Angstroms.
Figure 9:
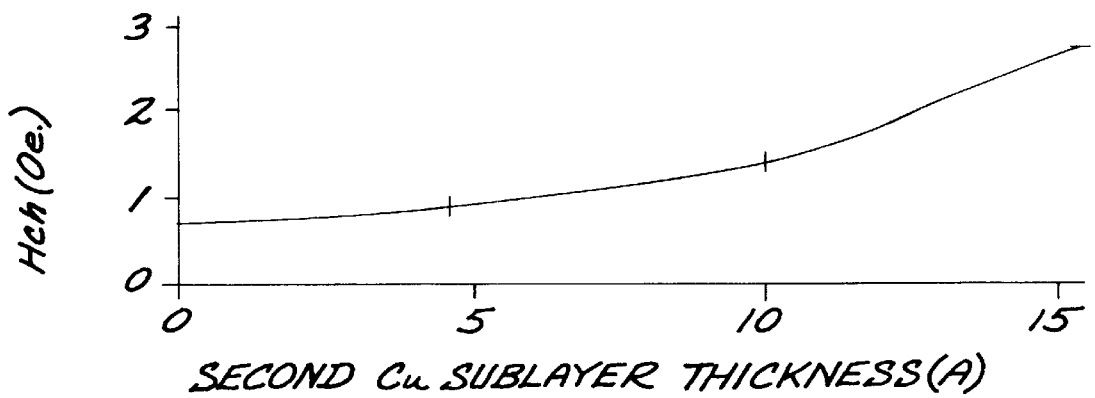
FIG. 9 is a graph of Hch in Oersteds as a function of the second copper sublayer thickness in Angstroms.

The present invention was reduced to practice using the method of FIG. 2 to fabricate the GMR sensor structure 50 depicted in FIG. 3. Four specimens were prepared, in each case with the total thickness of the oxidized copper spacer layer 98 constant at 20 Angstroms. The thickness of the second copper sublayer 102 was varied from zero (i.e., the spacer is a single layer), to 5, 10, and 15 Angstroms in the four specimens. FIGS. 4–9 present some of the results obtained, with the measured or measured-and-calculated parameter presented as a function of the thickness of the second copper sublayer 102. As seen in FIG. 5, dR/R is greatest when the thickness of the second copper sublayer 102 is about 10 Angstroms, so that the total thickness of the oxidized copper spacer layer 98 is approximately equally divided between the two copper sublayers 100 and 102. Extending this observation, if there were four copper sublayers, for example, they each would desirably be about ¼ of the total thickness of the oxidized copper spacer layer 98, or about 5 Angstroms thickness of each sublayer in the preferred case to maintain the total thickness of the oxidized copper spacer layer 98 at about 20 Angstroms. FIGS. 7–9 report properties of the MR sensor structure. In FIGS. 7 and 9, respectively, it is desirable that Hk and Hch be maintained at a relatively low level.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for fabricating a magnetoresistance sensor structure, comprising the steps of:

providing a substrate structure;

depositing a magnetic pinning structure on the substrate structure;

depositing an oxidized metallic spacer layer overlying the magnetic pinning structure by the steps of
depositing a first metallic sublayer,
oxidizing the first metallic sublayer,
depositing a second metallic sublayer, and
oxidizing the second metallic sublayer; and depositing a sensing structure overlying the oxidized metallic spacer layer.

2. The method of claim 1, wherein the metallic sublayers are copper.

3. The method of claim 1, wherein the step of depositing the oxidized metallic spacer layer includes the step of depositing the oxidized metallic spacer layer having a total thickness of from about 15 Angstroms to about 25 Angstroms.

4. The method of claim 1, wherein the step of depositing the second metallic sublayer includes the step of depositing the second metallic sublayer to have about the same thickness as the first metallic sublayer.

5. The method of claim 1, wherein the step of depositing the oxidized metallic spacer layer includes the steps of depositing the first metallic sublayer in a vacuum having a first-deposition oxygen partial pressure, oxidizing the first metallic sublayer in a vacuum having a first-oxidation oxygen partial pressure greater than the first-deposition oxygen partial pressure, depositing the second metallic sublayer in a vacuum having a second-deposition oxygen partial pressure, and oxidizing the second metallic sublayer in a vacuum having a second-oxidation oxygen partial pressure greater than the second-deposition oxygen partial pressure.

6. The method of claim 1, wherein the step of oxidizing the first metallic sublayer and the step of oxidizing the second metallic sublayer each include a step of providing an oxidizing environment having an oxygen partial pressure of about $2 \times 10^{-5}$ Torr.

7. The method of claim 1, including an additional step, after the step of depositing the sensing structure, of depositing a cap layer overlying the sensing structure.

8. The method of claim 1, including an additional step of depositing a magnetic biasing structure.

9. A method for fabricating a magnetoresistance sensor structure, comprising the steps of:

providing a substrate structure;

depositing a magnetic pinning structure on the substrate structure;

depositing an oxidized copper spacer layer overlying the magnetic pinning structure by the steps of
depositing a first copper sublayer,
oxidizing the first copper sublayer,
depositing a second copper sublayer, and
oxidizing the second copper sublayer; and depositing a sensing structure overlying the oxidized copper spacer layer.

10. The method of claim 9, wherein the step of providing the substrate structure includes the step of providing an aluminum oxide substrate with a seed layer structure thereon.

11. The method of claim 9, wherein the step of depositing the oxidized copper spacer layer includes the steps of depositing the first copper sublayer in a vacuum having a first-deposition oxygen partial pressure, oxidizing the first copper sublayer in a vacuum having a first-oxidation oxygen partial pressure greater than the first-deposition oxygen partial pressure, depositing the second copper sublayer in a vacuum having a second-deposition oxygen partial pressure, and oxidizing the second copper sublayer in a vacuum having a second-oxidation oxygen partial pressure greater than the second-deposition oxygen partial pressure.

12. The method of claim 9, wherein the step of depositing the oxidized copper spacer layer includes the step of depositing the oxidized copper spacer layer having a total thickness of from about 15 Angstroms to about 25 Angstroms.

13. The method of claim 9, wherein the step of depositing the second copper sublayer includes the step of, depositing the second copper sublayer to have about the same thickness as the first copper sublayer.

14. The method of claim 9, wherein the step of oxidizing the first copper sublayer and the step of oxidizing the second copper sublayer each include a step of providing an oxidizing environment having an oxygen partial pressure of about $2 \times 10^{-5}$ Torr.

15. The method of claim 9, wherein the step of depositing the oxidized copper spacer layer includes the steps of depositing a third copper sublayer, oxidizing the third copper sublayer.

16. The method of claim 9, including an additional step, after the step of depositing the sensing structure, of depositing a cap layer overlying the sensing structure.

17. The method of claim 9, including an additional step of depositing a magnetic biasing structure.

\* \* \* \* \*